US011211767B2

(12) United States Patent
Wu et al.

(10) Patent No.: US 11,211,767 B2
(45) Date of Patent: Dec. 28, 2021

(54) REFLECTOR STRUCTURE FOR TUNABLE LASER AND TUNABLE LASER

(71) Applicant: HUAWEI TECHNOLOGIES CO., LTD., Guangdong (CN)

(72) Inventors: Lin Wu, Wuhan (CN); Hongmin Chen, Wuhan (CN)

(73) Assignee: HUAWEI TECHNOLOGIES CO., LTD., Guangdong (CN)

( * ) Notice: Subject to any disclaimer, the term of this patent is extended or adjusted under 35 U.S.C. 154(b) by 15 days.

(21) Appl. No.: 16/674,283

(22) Filed: Nov. 5, 2019

(65) Prior Publication Data

US 2020/0076155 A1 Mar. 5, 2020

Related U.S. Application Data

(63) Continuation of application No. PCT/CN2017/114689, filed on Dec. 6, 2017.

(30) Foreign Application Priority Data

May 9, 2017 (CN) ......................... 201710322040.1

(51) Int. Cl.
*H01S 5/024* (2006.01)
*H01S 5/026* (2006.01)
(Continued)

(52) U.S. Cl.
CPC ........ *H01S 5/0261* (2013.01); *H01S 5/02453* (2013.01); *H01S 5/02461* (2013.01);
(Continued)

(58) Field of Classification Search
None
See application file for complete search history.

(56) References Cited

U.S. PATENT DOCUMENTS 6,700,910 B1 3/2004 Aoki et al.
8,861,556 B2 10/2014 Larson
(Continued)

FOREIGN PATENT DOCUMENTS

CN 101841129 A 9/2010
CN 102414600 A 4/2012
(Continued)

OTHER PUBLICATIONS

Y. Matsui et al. ("Narrow linewidth tunable semiconductor laser," 2016 Compound Semiconductor Week (CSW) [Includes 28th International Conference on Indium Phosphide & Related Materials (IPRM) & 43rd International Symposium on Compound Semiconductors (ISCS), Toyama, Japan, 2016, pp. 1-2) (Year: 2016).*
(Continued)

*Primary Examiner* — Tod T Van Roy
(74) *Attorney, Agent, or Firm* — Westerman, Hattori, Daniels & Adrian, LLP

(57) ABSTRACT

A reflector structure for a tunable laser and a tunable laser. A super structure grating is used as a reflector structure, and a suspended structure is formed around a region in which the super structure grating is located, to implement, using the suspended structure, thermal isolation around the region in which the super structure grating is located, and increase thermal resistance, such that less heat is lost, and heat is concentrated in the region in which the super structure grating is located, thereby improving thermal tuning efficiency of the reflector structure. Moreover, lateral support structures are disposed on two sides of the suspended structure, to provide a mechanical support for the suspended structure. In addition, regions in the super structure grating that correspond to any two lateral support structures on a same side of the suspended structure fall at different locations in a spatial period of the super structure grating.

20 Claims, 13 Drawing Sheets

(51) Int. Cl.

| | |
|---|---|
| ***H01S 5/06*** | (2006.01) |
| ***H01S 5/0625*** | (2006.01) |
| ***H01S 5/20*** | (2006.01) |
| ***H01S 5/12*** | (2021.01) |
| *H01S 5/125* | (2006.01) |
| *H01S 5/10* | (2021.01) |

(52) U.S. Cl.

CPC ........ *H01S 5/0612* (2013.01); *H01S 5/06256* (2013.01); *H01S 5/1218* (2013.01); *H01S 5/2045* (2013.01); *H01S 5/1007* (2013.01); *H01S 5/125* (2013.01)

(56) References Cited

U.S. PATENT DOCUMENTS

| | | | |
|---|---|---|---|
| 9,240,673 B2 * | 1/2016 | Rickman | H01S 5/3031 |
| 10,666,014 B2 * | 5/2020 | He | H01S 5/0612 |
| 10,931,085 B2 * | 2/2021 | Wu | G02B 5/1871 |
| 2002/0080838 A1 | 6/2002 | Orita et al. | |
| 2009/0074020 A1 | 3/2009 | Matsui et al. | |
| 2010/0142562 A1 * | 6/2010 | Ito | G06F 13/4291 370/503 |
| 2010/0247021 A1 | 9/2010 | Cunningham et al. | |
| 2014/0010248 A1 | 1/2014 | Larson | |
| 2014/0321488 A1 | 10/2014 | Chen et al. | |
| 2014/0348187 A1 | 11/2014 | Chen et al. | |
| 2016/0118772 A1 | 4/2016 | Chen et al. | |
| 2018/0183207 A1 * | 6/2018 | Audet | H01S 5/0612 |
| 2018/0331497 A1 * | 11/2018 | Evans | G02B 26/04 |
| 2018/0331498 A1 | 11/2018 | Evans et al. | |

FOREIGN PATENT DOCUMENTS

| | | | |
|---|---|---|---|
| CN | 102519638 | A | 6/2012 |
| CN | 102570313 | A | 7/2012 |
| CN | 103185604 | A | 7/2013 |
| CN | 103532009 | A | 1/2014 |
| CN | 105409071 | A | 3/2016 |
| CN | 105556770 | A | 5/2016 |
| CN | 108732667 | A | 11/2018 |
| EP | 3605159 | A1 | 2/2020 |
| JP | 2012174938 | A | 9/2012 |
| JP | 2014017481 | A | 1/2014 |
| JP | 2015170750 | A | 9/2015 |
| WO | 03/023463 | A2 | 3/2003 |
| WO | 2017120269 | A1 | 7/2017 |

OTHER PUBLICATIONS

Notice of Allowance dated Dec. 8, 2020, issued in counterpart JP Application No. 2019-561996, with English Translation. (5 pages).

Office Action dated Aug. 27, 2020, issued in counterpart CN Application No. 20170322040.1, with English translation (20 pages).

Search Report dated May 9, 2017, issued in counterpart TW Application No. 2017103220401 (2 pages).

Jiang Shan et al.,"Progresses on monolithic integrated tunable laser diodes", Study On Optical Communications, (Sum. No. 151), Feb. 2009, total 5 pages. With an English Abstract.

Notice of Allowance dated Dec. 2, 2020, issued in counterpart CN Application No. 201710322040.1, with English Translation. (8 pages).

Extended (Supplementary)European Search Report dated Mar. 31, 2020, issued in counterpart EP Application No. 17908778.8. (6 pages).

H. Cai et al.:"A miniature tunable coupled-cavity laser constructed by micromachining technology",dated Jan. 23, 2008. (3 pages).

Wesström J O, Sarlet G, Hammerfeldt S, et al., "State-of-the-art performance of widely tunable modulated grating Y-branch lasers",[C]// Optical Fiber Communication Conference, Optical Society of America, 2004: TuE2. (3 pages).

International Search Report dated Mar. 5, 2018, issued in counterpart application No. PCT/CN2017/114689, with English translation. (18 pages).

Office Action dated Dec. 3, 2019, issued in counterpart CN application No. 201710322040.1, with English translation. (10 pages).

Notice of Allowance dated May 26, 2021, issued in counterpart EP Application No. 17 908 778.8. (50 pages).

* cited by examiner

Prior Art

REFLECTOR STRUCTURE FOR TUNABLE LASER AND TUNABLE LASER

CROSS-REFERENCE TO RELATED APPLICATIONS

This application is a continuation Application of International Patent application No. PCT/CN2017/114689, filed on Dec. 6, 2017, which claims priority to Chinese Patent Application No. 201710322040.1, filed on May 9, 2017, The disclosures of the aforementioned applications are hereby incorporated by reference in their entireties.

TECHNICAL FIELD

This application relates to the laser field, and more specifically, to a reflector structure for a tunable laser and a tunable laser.

BACKGROUND

In the optical communications field, a tunable laser (TL) is a laser whose output wavelength can be tuned within a specific range. A monolithically integrated tunable laser has advantages such as a small size and high integration, and therefore becomes a mainstream technology in the current optical communications field.

A monolithically integrated Y-branch tunable laser is used as an example. As shown in FIG. 1, the monolithically integrated Y-branch tunable laser includes a gain region, a phase region, a multimode interference (MMI) coupler, a reflector structure 1, and a reflector structure 2. An active gain region is usually a multiple quantum well (MQW), and converts electric energy into optical energy when a current is injected into the active gain region, to provide a gain. Reflectance spectrums of the reflector structure 1 and the reflector structure 2 are wavelength selective, and used for wavelength tuning. A common reflector in the reflector structure may be a distributed Bragg reflector (DBR) or a microring. Wavelength tuning by the monolithically integrated Y-branch tunable laser is essentially tuning a refractive index of a reflector or an optical waveguide in the phase region. Principles of tuning a refractive index of the optical waveguide mainly include a quantum-confined Stark effect (QCSE), current injection, and thermal tuning. The QCSE makes a relatively small change in the refractive index, and is relatively less applied to a laser. The current injection makes a large change in the refractive index and makes a very fast transient response (at a nanosecond level), and is widely applied. However, the current injection causes a great waveguide loss, and consequently a laser ray width of a laser reaches a megahertz level, and cannot meet a requirement of a coherent optical communications system. In the thermal tuning, the refractive index is changed by changing a temperature effect of a material. Although the thermal tuning achieves a lower response rate than the current injection, the thermal tuning causes a much smaller tuning loss than the current injection, and can implement a ray width less than 400 kilohertz (kHz), to meet the requirement of the coherent optical communications system. However, for a same wavelength tuning range, the current injection tuning causes much lower power consumption than the thermal tuning. For example, for 6 nm tuning of a reflectance spectrum of a DBR, power consumption (for example, greater than 100 milliwatts (mW)) of a thermal tuning component may far exceed power consumption (about 15 mW) of a current-based tuning component. In conclusion, compared with the current injection tuning, an advantage of the thermal tuning is that a narrower laser ray width can be obtained, and a disadvantage of the thermal tuning is that the power consumption of the tuning component is excessively large.

The thermal tuning is implemented by placing a heater (generally a heating resistor) in a reflector region in the reflector structure. Temperature of the heater can be changed by tuning power of the heater to change temperature of the reflector region. Finally, a refractive index of the reflector region is changed according to a temperature effect to tune a wavelength location of a reflection peak of a reflector. For a same wavelength tuning range, lower power consumption of the thermal tuning component in the tunable laser means higher thermal tuning efficiency of the tuning component and lower overall power consumption of the laser.

SUMMARY

This application provides a reflector for a tunable laser and a tunable laser, to reduce overall power consumption of the tunable laser.

According to a first aspect, a reflector structure for a tunable laser is provided. The reflector structure includes:

a substrate layer, a support layer, a lower cladding layer, a waveguide layer, an upper cladding layer, and a heating layer that are stacked in sequence from bottom to top.

The reflector structure further includes a super structure grating, the super structure grating is disposed between the upper cladding layer and the lower cladding layer along a propagation direction of light in the waveguide layer, and the heating layer is located in a region that is on an upper surface of the upper cladding layer and that is right opposite to the super structure grating.

The support layer includes a first support sublayer and a second support sublayer, the first support sublayer and the second support sublayer are located on two sides of an upper surface of the substrate layer along the propagation direction of light in the waveguide layer, space extending along the propagation direction of light in the waveguide layer is formed among the substrate layer, the first support sublayer, the second support sublayer, and the lower cladding layer, a first column of openings and a second column of openings are disposed on the upper surface of the upper cladding layer along the propagation direction of light in the waveguide layer, the first column of openings and the second column of openings are respectively located on two sides of the region that is on the upper surface of the upper cladding layer and that is right opposite to the super structure grating, the first column of openings and the second column of openings each include a plurality of openings, and each opening reaches the space by downwards penetrating through the upper cladding layer, the waveguide layer, and the lower cladding layer.

A suspended structure is formed in a region that is above the space and that is located between the first column of openings and the second column of openings, and a lateral support structure of the suspended structure is formed in a region between two adjacent openings in the first column of openings and the second column of openings.

A first lateral support structure corresponds to a first region of a first spatial period in the super structure grating, a second lateral support structure corresponds to a second region of a second spatial period in the super structure grating, a relative location of the first region in the first spatial period is different from a relative location of the second region in the second spatial period, and the first lateral support structure and the second lateral support structure are any two lateral support structures located on a same side of the suspended structure. A spatial period of the super structure grating is a distance that corresponds to a period of a modulation function of the super structure grating on the super structure grating.

The first spatial period of the super structure grating and the second spatial period of the super structure grating may be a same spatial period located on the super structure grating, or may be different spatial periods located on the super structure grating.

That a relative location of the first region in the first spatial period is different from a relative location of the second region in the second spatial period includes that a distance from the first region to a start point (or an end point) of the first spatial period is different from a distance from the second region to a start point (or an end point) of the second spatial period.

In the reflector structure for a tunable laser in this embodiment of the present disclosure, the super structure grating is used as a reflector, and the suspended structure is formed around a region in which the super structure grating is located, to implement, using the suspended structure, thermal isolation around the region in which the super structure grating is located, and increase thermal resistance, such that less heat is lost, and heat is concentrated in the region in which the super structure grating is located, thereby improving thermal tuning efficiency of the reflector structure, and helping reduce overall power consumption of the tunable laser. Moreover, lateral support structures are disposed on two sides of the suspended structure, to provide a mechanical support for the suspended structure. In addition, regions in the super structure grating that correspond to any two lateral support structures on a same side of the suspended structure fall at different locations in the spatial period of the super structure grating. This helps avoid deterioration of flatness of a reflectance spectrum of the super structure grating during thermal tuning, thereby helping avoid deterioration of performance of the tunable laser.

In some possible implementations, a quantity of openings in at least one column of openings of the first column of openings or the second column of openings is different from a quantity of modulation periods of the super structure grating.

In some possible implementations, the first column of openings and the second column of openings include a same quantity of openings.

In some possible implementations, the first column of openings and the second column of openings are symmetric with respect to a center line between the first column of openings and the second column of openings.

In some possible implementations, the first column of openings and the second column of openings each include a plurality of regularly arranged openings, and a distance between any two adjacent openings in the first column of openings and/or the second column of openings is different from a spatial period of the super structure grating. Herein, the plurality of regularly arranged openings mean that all of the plurality of openings are equal in size, and a same distance exists between every two adjacent openings.

In some possible implementations, the support layer further includes at least one bottom support structure, and the at least one bottom support structure is configured to support, from bottom, the suspended structure that is above the space and that is located between the first column of openings and the second column of openings.

The bottom support structure is disposed to provide a bottom support for the suspended structure, such that mechanical strength of the suspended structure can be further enhanced.

In some possible implementations, the at least one bottom support structure is a plurality of bottom support structures, the plurality of bottom support structures are arranged in the space along the propagation direction of light in the waveguide layer, and a region between at least two adjacent bottom support structures of the plurality of bottom support structures is staggered from a modulation peak or a modulation valley of the super structure grating.

In some possible implementations, each opening has a different width in the propagation direction of light in the waveguide layer.

In this way, in a reflector structure manufacturing process, the bottom support structure can be formed at a relatively-narrow-opening part by injecting an etchant into these openings.

In some possible implementations, the reflector structure further includes:

an upper barrier layer and a lower barrier layer, where the upper barrier layer is located between the lower cladding layer and the support layer, and the lower barrier layer is located between the support layer and the substrate layer.

The upper barrier layer and the lower barrier layer are disposed, such that the lower cladding layer and the substrate layer can be prevented from being etched.

In some possible implementations, the reflector structure further includes:

a dielectric layer, where the dielectric layer is located between the upper cladding layer and the heating layer, and the heating layer is located in a region that is on an upper surface of the dielectric layer and that is right opposite to the super structure grating. The dielectric layer can be configured to prevent a current of a heater from leaking into the upper cladding layer.

In some possible implementations, the dielectric layer further covers an inner wall of each opening. This can protect side surfaces of the upper cladding layer, the waveguide layer, and the lower cladding layer from being etched by an etchant.

In some possible implementations, the super structure grating is located in the upper cladding layer, or partially located in the upper cladding layer and partially located in the waveguide layer, or located in the waveguide layer, or partially located in the lower cladding layer and partially located in the waveguide layer, or located in the lower cladding layer.

In some possible implementations, the modulation function of the super structure grating is shown as follows $$P(z) = \begin{cases} \sum_{k=1}^{N} \cos(2\pi\Delta Fz(k-0.5)+\phi_k) & \text{For an even quantity of reflection peaks} \\ 1+2\sum_{k=1}^{N} \cos(2\pi k\Delta Fz+\phi_k) & \text{For an odd quantity of reflection peaks} \end{cases}$$

N is a quantity of reflection peaks of the modulation function of the super structure grating, and is a natural number, $\varnothing_k$ is a phase, z represents a location on the super structure grating along a propagation direction of light, $$\Delta F = \frac{1}{\Lambda_{k+1}} - \frac{1}{\Lambda_k},$$

and $\Lambda_k$ is a spatial period of a cosine function.

According to a second aspect, a tunable laser is provided. The tunable laser includes:

a gain region, a first phase region, a multimode interference coupler, a first reflector structure, and a second reflector structure.

A first end of the first phase region is connected to a first end of the gain region, a second end of the first phase region is connected to a first end of the multimode interference coupler, a second end of the multimode interference coupler is connected to a first end of the first reflector structure, and a third end of the multimode interference coupler is connected to a first end of the second reflector.

At least one of the first reflector structure and the second reflector structure uses the reflector structure in the first aspect or any one of the foregoing possible implementations of the first aspect.

In the tunable laser in this embodiment of the present disclosure, the reflector structure in the first aspect or any one of the foregoing possible implementations of the first aspect is used to help reduce overall power consumption of the tunable laser.

In some possible implementations, the tunable laser further includes a second phase region.

A first end of the second phase region is connected to the second end of the multimode interference coupler, and a second end of the second phase region is connected to the first end of the first reflector structure; or a first end of the second phase region is connected to the third end of the multimode interference coupler, and a second end of the second phase region is connected to the first end of the second reflector structure.

In some possible implementations, the tunable laser further includes one or more semiconductor optical amplifiers SOAs. Each SOA is connected to a second end of the gain region, or connected to a second end of the first reflector structure, or connected to a second end of the second reflector structure. The SOA is integrated, such that optical output power of the tunable laser can be amplified.

In some possible implementations, the tunable laser further includes one or more photodiodes PDs. Each PD is connected to a second end of the gain region, or connected to a second end of the first reflector structure, or connected to a second end of the second reflector structure. The PD is integrated, such that power monitoring or power attenuation can be performed on the tunable laser.

In some possible implementations, both an SOA and a PD may alternatively be integrated into the tunable laser. For example, the SOA may be connected to a second end of the gain region, and the PD is connected to a second end of the first reflector structure or the second reflector structure, as shown in FIG. 19. It should be understood that, alternatively, the SOA may be connected to a second end of the first reflector structure or the second reflector structure, and the PD is connected to a second end of the gain region. In this way, optical output power of the tunable laser can be amplified, and further power monitoring or power attenuation can be performed.

According to a third aspect, a tunable laser is provided. The tunable laser includes:

a first reflector structure, a gain region, a phase region, and a second reflector structure.

A first end of the first reflector structure is connected to a first end of the gain region, a second end of the gain region is connected to a first end of the phase region, and a second end of the phase region is connected to a first end of the second reflector structure.

At least one of the first reflector structure and the second reflector structure uses the reflector structure in the first aspect or any one of the foregoing possible implementations of the first aspect.

In the tunable laser in this embodiment of the present disclosure, the reflector structure in the first aspect or any one of the foregoing possible implementations of the first aspect is used to help reduce overall power consumption of the tunable laser.

In some possible implementations, the tunable laser further includes one or two semiconductor optical amplifiers SOAs. Each SOA is connected to a second end of the first reflector structure or the second reflector structure. The SOA is integrated, such that optical output power of the tunable laser can be amplified.

In some possible implementations, the tunable laser further includes one or two photodiodes PDs. Each PD is connected to a second end of the first reflector structure or the second reflector structure. The PD is integrated, such that power monitoring or power attenuation can be performed on the tunable laser.

In some possible implementations, both an SOA and a PD may alternatively be integrated into the tunable laser. For example, the SOA is connected to a second end of the first reflector structure, and the PD is connected to a second end of the second reflector structure; or the SOA is connected to a second end of the second reflector structure, and the PD is connected to a second end of the first reflector structure. In this way, optical output power of the tunable laser can be amplified, and further power monitoring or power attenuation can be performed.

DESCRIPTION OF EMBODIMENTS

Figure 1:
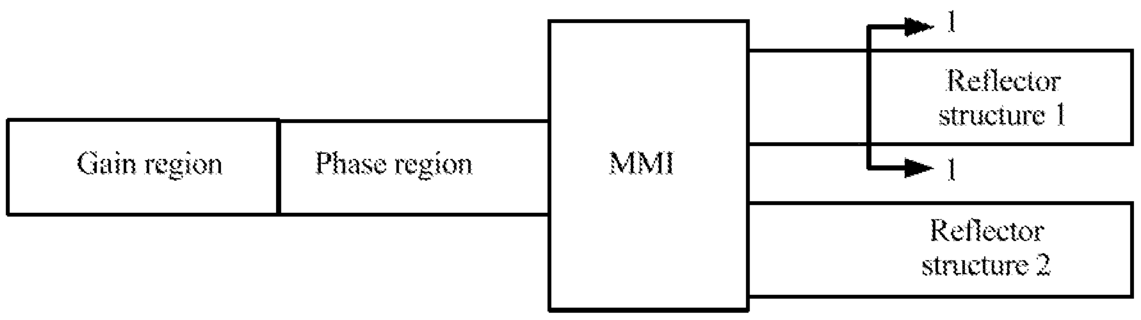
FIG. 1 is a schematic structural diagram of a Y-branch tunable laser.

The following describes the technical solutions in this application with reference to the accompanying drawings.

In the description of the present disclosure, the terms "center," "horizontal," "vertical," "length," "width," "thickness," "upper," "lower," "front," "back," "left," "right," "vertical," "horizontal," "top," "bottom," "inner," "outer," or the like are based on the orientation or positional relationship shown in the drawings. They are used merely for convenience of description and simplifying description of the present invention, but not to indicate or imply that the indicated apparatus or element must have a specific orientation, or be constructed and operated in a specific orientation, therefore cannot be construed as a limitation of the present disclosure. In addition, the terms "first" and "second" may be added as prefixes. These prefixes, however, are only added in order to distinguish the terms and do not have specific meaning such as order and relative merits.

Figure 2:
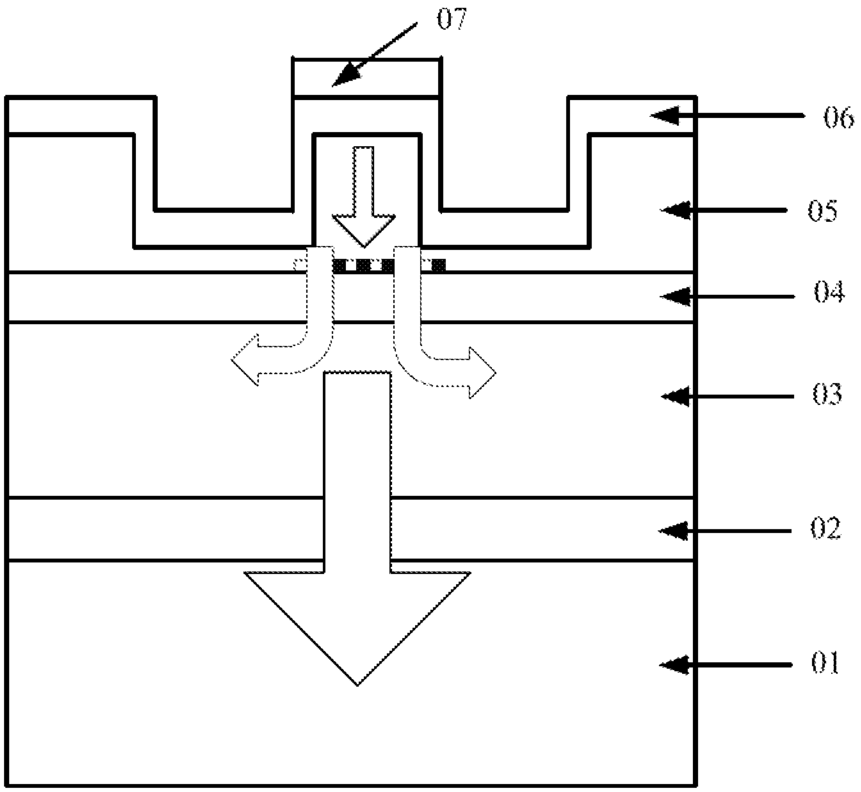
FIG. 2 is a schematic view of a cross section of a reflector structure for a tunable laser in the prior art.

FIG. 2 is a schematic view of a cross section 1-1 of a reflector structure 1 of FIG. 1 for which a thermal tuning manner is used. As shown in FIG. 2, the reflector structure includes a substrate layer 01, a buffer layer 02, a lower cladding layer 03, a waveguide layer 04, an upper cladding layer 05, a dielectric layer 06, and a heating layer 07 in sequence from bottom to top. The reflector structure further includes a reflector 08 (as shown by a black-and-white part in FIG. 2). The reflector 08 is located at an interface between the waveguide layer 04 and the upper cladding layer 05.

The waveguide layer 04 is configured to provide a low-loss light propagation channel. Refractive indexes of the upper cladding layer 05 and the lower cladding layer 03 are lower than that of the waveguide layer 04. Therefore, total reflection occurs when light is propagated in the waveguide layer 04, such that optical energy can be restricted to the waveguide layer as much as possible. For example, the waveguide layer 04 may be made of indium gallium arsenide phosphide (InGaAsP), and the upper cladding layer 05 and the lower cladding layer 03 may be made of indium phosphide (InP). The material InP has a lower refractive index than InGaAsP, and therefore total reflection occurs when light is propagated in the waveguide layer 04.

A heater is placed in the heating layer 07 to change temperature of a reflector region.

The dielectric layer 06 is configured to prevent a current of the heater from leaking into the upper cladding layer 05. The dielectric layer 06 may be made of an insulating material. For example, the dielectric layer 06 may be made of an insulating material such as silicon dioxide ($SiO_2$) or aluminum oxide ($Al_2O_3$).

The reflector is disposed at the interface between the waveguide layer 04 and the upper cladding layer 05 (as shown by the black-and-white part in FIG. 2).

During thermal tuning, because an effective refractive index of the reflector region in the reflector structure changes with temperature, a wavelength location of a reflection peak of the reflector moves to tune a wavelength.

A material of the buffer layer 02 may be indium phosphide (InP). The buffer layer 02 disposed between the substrate layer 01 and the lower cladding layer 03 is configured to provide the material InP of better quality, to provide a better material basis for a material of another layer, thereby facilitating growth of the material of the another layer. It should be noted that the buffer layer 02 may alternatively not be disposed. If the buffer layer 02 is not disposed, the lower cladding layer 03 is directly disposed on an upper surface of the substrate layer 01.

As shown by block arrows in FIG. 2, temperature of the heater increases after being heated, and heat is conducted to the reflector region and the waveguide layer 04 by flowing through the dielectric layer 06 and the upper cladding layer 05 in sequence. However, a large amount of heat continues to be propagated downwards to the lower cladding layer 03, the buffer layer 02, or even the very thick substrate layer 01. In addition, some heat is horizontally propagated to two sides of the heater. Such heat is all dissipated, rather than functions to change temperature of the reflector region. Instead, the dissipated heat further increases temperature of a non-reflector region (for example, a gain region), resulting in thermal crosstalk. A large amount of heat is lost due to dissipation, and this is definitely an important cause for relatively high power consumption of a thermal tuning component.

Therefore, some embodiments of the present disclosure provide a reflector structure for a tunable laser, to implement, using a suspended structure, thermal isolation around a reflector and a waveguide layer in which the reflector is located, and increase thermal resistance, such that less heat is lost, and heat is concentrated in a reflector region.

The reflector structure for a tunable laser according to some embodiments of the present disclosure is described below with reference to accompanying drawings.

Figure 3:
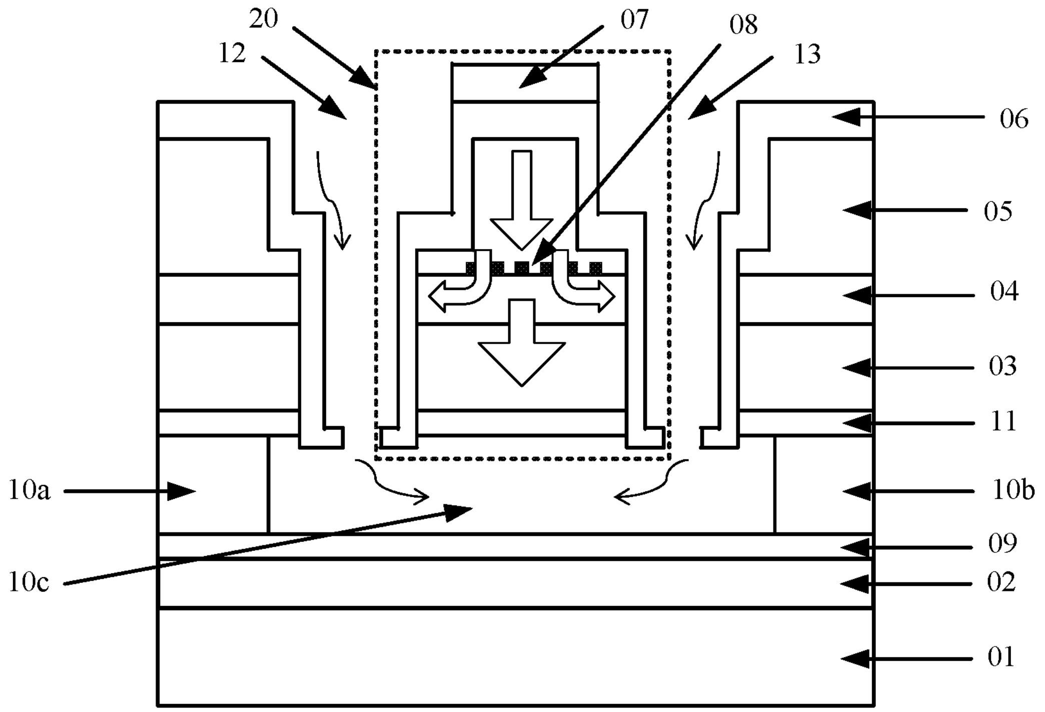
FIG. 3 is a schematic view of a cross section of a reflector structure for a tunable laser according to an embodiment of the present disclosure.

FIG. 3 is a schematic view of a cross section of a reflector structure for a tunable laser according to an embodiment of the present disclosure. As shown in FIG. 3, the reflector structure includes a substrate layer 01, a buffer layer 02, a lower barrier layer 09, a support layer 10, an upper barrier layer 11, a lower cladding layer 03, a waveguide layer 04, an upper cladding layer 05, a dielectric layer 06, and a heater 07 that are stacked in sequence from bottom to top.

The support layer 10 includes a first support sublayer 10*a* and a second support sublayer 10*b*. The first support sublayer 10*a* and the second support sublayer 10*b* are located on two sides of an upper surface of the lower barrier layer 09 along a propagation direction of light in the waveguide layer 04, and a space 10*c* extending along the propagation direction of light in the waveguide layer 04 is formed among the lower barrier layer 09, the first support sublayer 10*a*, the second support sublayer 10*b*, and the upper barrier layer 11.

It should be noted that the reflector structure may alternatively include none of the buffer layer 02, the lower barrier layer 09, and the upper barrier layer 11. Correspondingly, the support layer 10 is directly disposed on an upper surface of the substrate layer 01. In other words, the first support sublayer 10*a* and the second support sublayer 10*b* are located on two sides of the upper surface of the substrate layer 01 along the propagation direction of light in the waveguide layer 04. In this case, the space 10*c* extending along the propagation direction of light in the waveguide layer 04 is formed among the substrate layer 01, the first support sublayer 10*a*, the second support sublayer 10*b*, and the lower cladding layer 03.

The reflector structure shown in FIG. 3 further includes a reflector 08 (as shown by a black-and-white part in FIG. 3). The reflector 08 may be a super structure grating (SSG). The super structure grating is disposed between the lower cladding layer 03 and the upper cladding layer 05 along the propagation direction of light in the waveguide layer 04. The heating layer 07 is located in a region that is on an upper surface of the dielectric layer 06 and that is right opposite or over the super structure grating 08.

Figure 4:
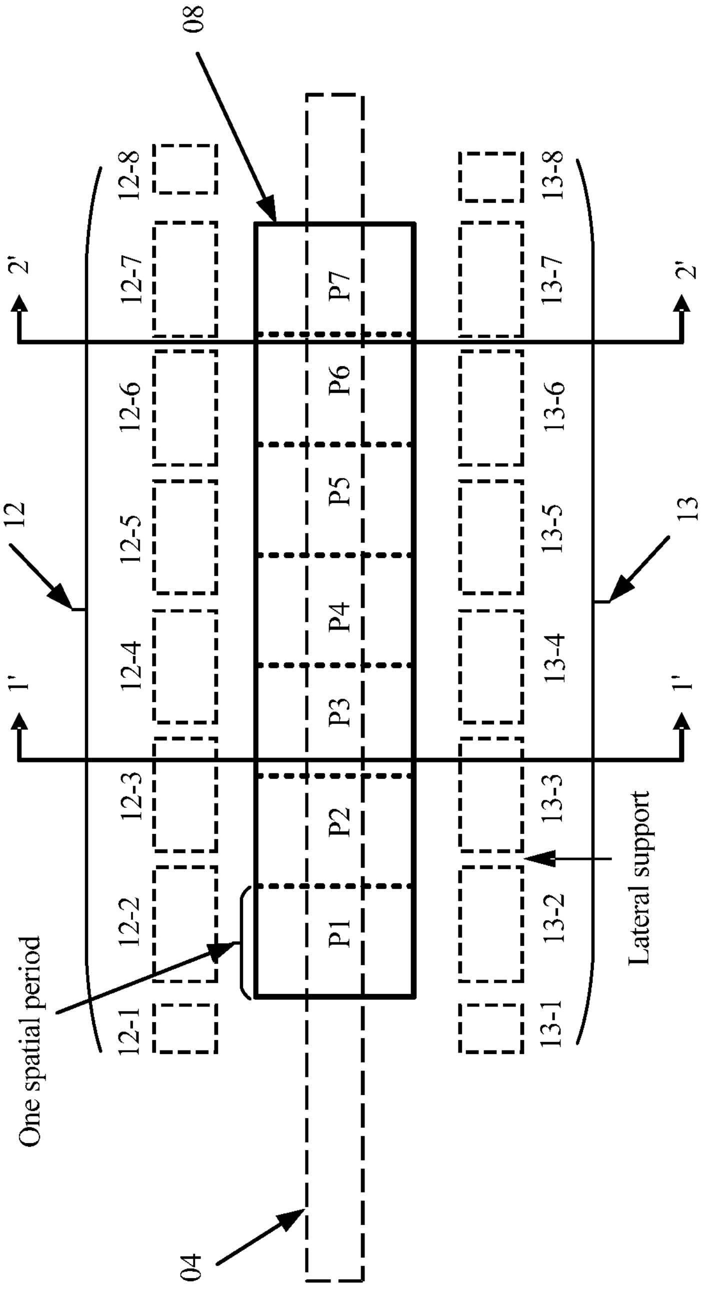
FIG. 4 is a top view of a reflector structure for a tunable laser according to an embodiment of the present disclosure.
Figure 5:
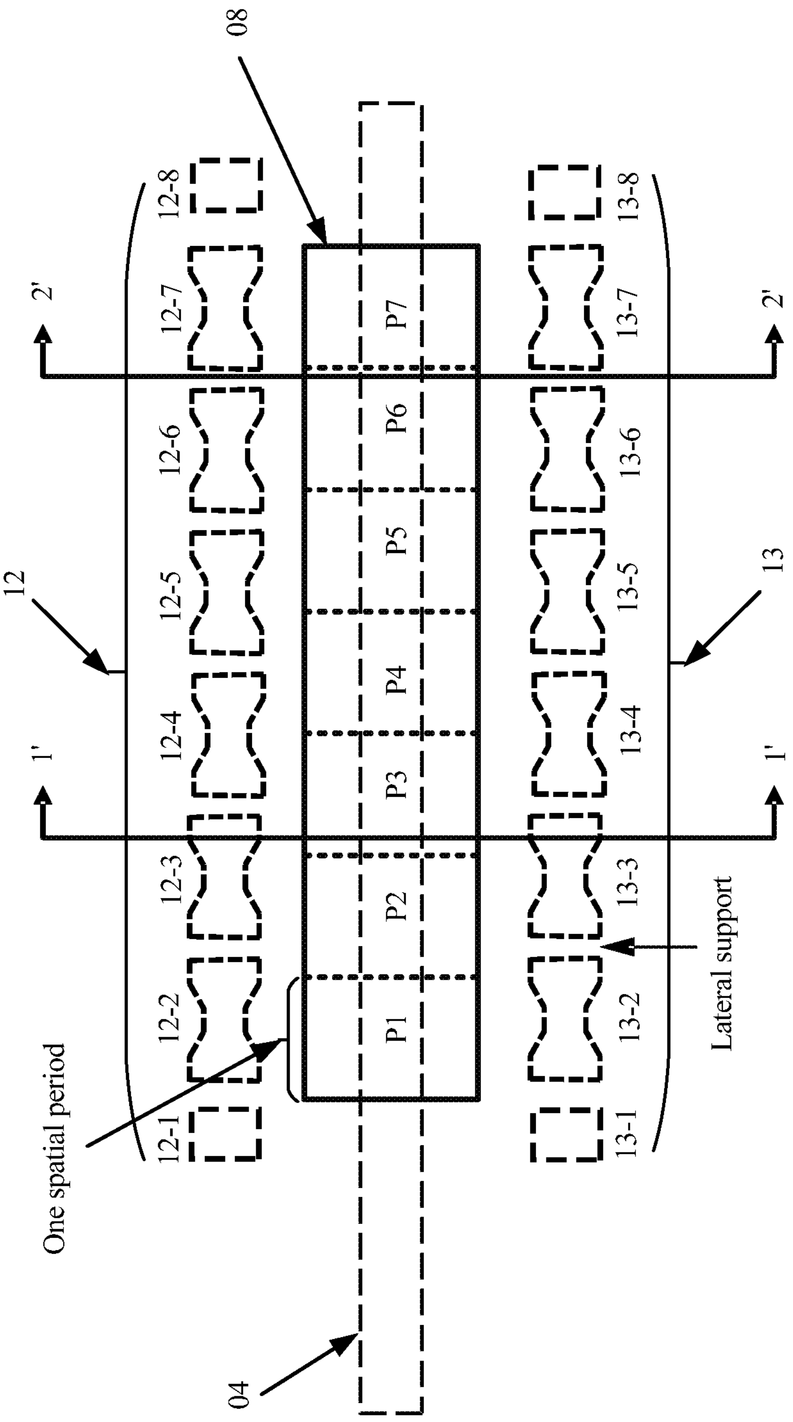
FIG. 5 is a top view of a reflector structure for a tunable laser according to another embodiment of the present disclosure.

FIG. 4 and FIG. 5 are two top views of the reflector structure shown in FIG. 3. P1 to P7 in FIG. 4 or FIG. 5 each correspond to one spatial period of the super structure grating. As shown in FIG. 4 and FIG. 5, a first column of openings 12 and a second column of openings 13 are disposed on the upper surface of the dielectric layer 06 along the propagation direction of light in the waveguide layer 04, the first column of openings 12 and the second column of openings 13 each include a plurality of openings (as shown by 12-1 to 12-8 and 13-1 to 13-8 in FIG. 4), and the first column of openings 12 and the second column of openings 13 are respectively located on two sides of the region that is on the upper surface of the dielectric layer 06 and that is right opposite to the super structure grating 08. FIG. 4 and FIG. 5 differ only in opening shape.

As shown in FIG. 3, each opening in the first column of openings 12 and the second column of openings 13 reaches the space 10*c* by downwards penetrating through the dielectric layer 06, the upper cladding layer 05, the waveguide layer 04, and the lower cladding layer 03. In this way, a suspended structure 20 is formed in a region that is above the space 10*c* and that is located between the first column of openings 12 and the second column of openings 13, as shown by a dashed-line box in FIG. 3.

In the reflector structure for a tunable laser in this embodiment of the present disclosure, the super structure grating is used as the reflector, and the suspended structure is formed around a region in which the super structure grating is located, to implement, using the suspended structure, thermal isolation around the region in which the super structure grating is located and increase thermal resistance. As such, less heat is lost, and heat is concentrated in the region in which the super structure grating is located, thereby improving thermal tuning efficiency of the reflector structure, and helping reduce overall power consumption of the tunable laser.

Optionally, as shown in FIG. 3, the dielectric layer 06 may further cover inner walls of the first column of openings 12 and the second column of openings 13. For example, the dielectric layer 06 may cover side surfaces of the upper cladding layer 05, the waveguide layer 04, the lower cladding layer 03, and the upper barrier layer 11. This can protect the side surfaces of the upper cladding layer 05, the waveguide layer 04, the lower cladding layer 03, and the upper barrier layer 11 from being etched by an etchant. However, this is not limited in this embodiment of the present disclosure. The dielectric layer 06 may cover only an upper surface of the upper cladding layer 05.

It should be noted that the dielectric layer 06 may alternatively not be disposed in the reflector structure in this embodiment of the present disclosure. In this case, the heating layer 07 may be directly disposed on the upper surface of the upper cladding layer 05.

Figure 6:
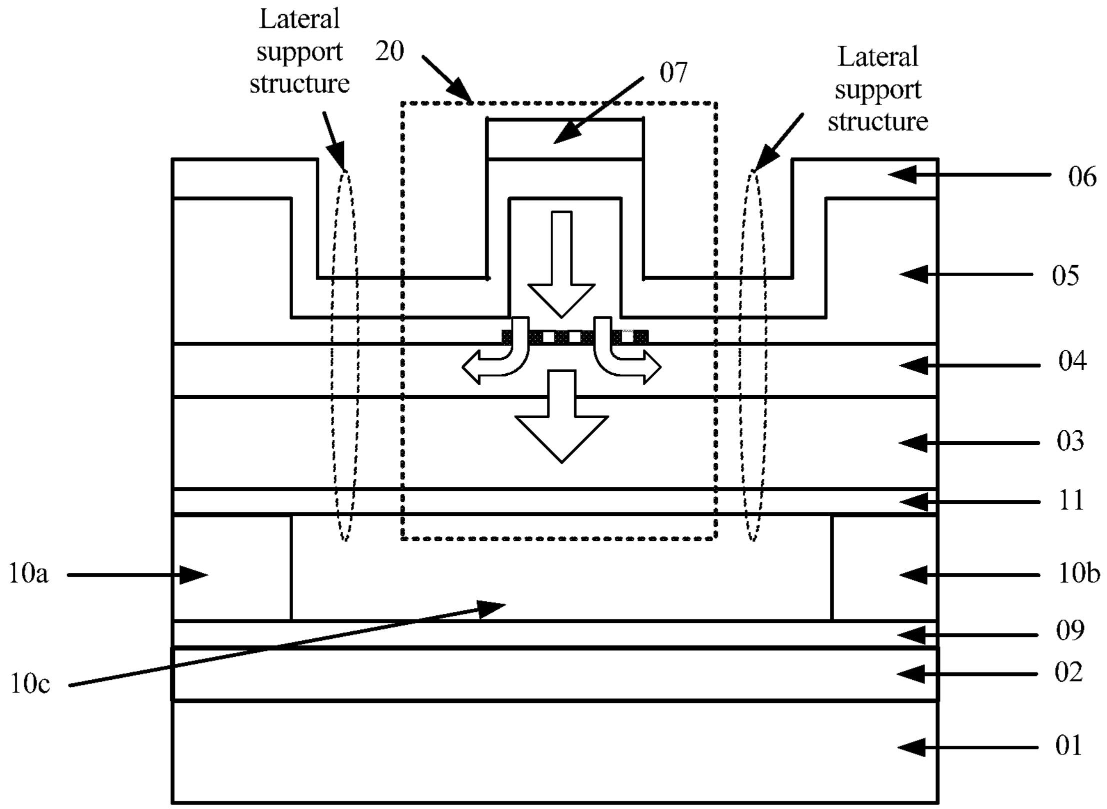
FIG. 6 is a schematic view of another cross section of a reflector structure for a tunable laser according to an embodiment of the present disclosure.

FIG. 3 is a schematic view of a cross section 1'-1' shown in FIG. 4, namely, a schematic view of a cross section of an opening region. FIG. 6 is a schematic view of a cross section 2'-2' in FIG. 4 or FIG. 5, namely, a schematic view of a cross section of an interval region between adjacent openings. Compared with the cross section shown in FIG. 3, none of the dielectric layer 06, the upper cladding layer 05, the waveguide layer 04, and the lower cladding layer 03 in an upper part of the cross section shown in FIG. 6 is etched, such that lateral support structures of the suspended structure 20 are formed to ensure a mechanical support for the entire suspended structure, thereby preventing the suspended structure 20 from collapsing or being damaged. Therefore, a region between two adjacent openings in each column of openings can be used as a lateral support between the suspended structure 20 and another region of the reflector structure.

Lateral support structures located on a same side of the suspended structure 20 can meet the following condition: A first lateral support structure corresponds to a first region of a first spatial period in the super structure grating, a second lateral support structure corresponds to a second region of a second spatial period in the super structure grating, and a relative location of the first region in the first spatial period is different from a relative location of the second region in the second spatial period. The first lateral support structure and the second lateral support structure are any two lateral support structures of a plurality of support structures located on a same side of the suspended structure 20.

Optionally, the first spatial period of the super structure grating and the second spatial period of the super structure grating may be a same spatial period located on the super structure grating. For example, the first spatial period and the second spatial period may be any one of seven spatial periods P1 to P7 shown in FIG. 4.

Optionally, the first spatial period of the super structure grating and the second spatial period of the super structure grating may alternatively be different spatial periods located on the super structure grating. For example, the first spatial period may be a spatial period P1 shown in FIG. 4, and the second spatial period may be any one of spatial periods P2 to P7 shown in FIG. 4.

It should be noted that, that a relative location of the first region in the first spatial period is different from a relative location of the second region in the second spatial period includes that a distance from the first region to a start point (or an end point) of the first spatial period is different from a distance from the second region to a start point (or an end point) of the second spatial period.

For example, the distance from the first region to the start point (or the end point) of the first spatial period and the distance from the second region to the start point (or the end point) of the second spatial period are calculated using a same method. For example, a distance from a region to a start point of a spatial period is a distance between a leftmost end of the region and the start point of the spatial period, or a distance between a rightmost end of the region and the start point of the spatial period.

In some embodiments, regions in the super structure grating that correspond to any two lateral support structures on a same side of the suspended structure fall at different locations in a spatial period of the super structure grating. This may include that the lateral support structures are staggered from a peak or a valley in the spatial period of the super structure grating 08. This helps avoid deterioration of flatness of a reflectance spectrum of the super structure grating during thermal tuning, thereby helping avoid deterioration of performance of the tunable laser. The peak in the spatial period of the super structure grating is a maximum value of a modulation function of the super structure grating in the spatial period. The valley in the spatial period of the super structure grating is a minimum value of the modulation function of the super structure grating in the spatial period.

The spatial period of the super structure grating is a distance that corresponds to a period of the modulation function of the super structure grating on the super structure grating.

During heating by a heater, because heat in a lateral support region may be dissipated along a lateral support, temperature of a region connected to the lateral support is slightly lower than temperature of another region. When a lateral support between openings is aligned with the peak or the valley of the modulation function of the super structure grating, a quantity of openings is equal to a quantity of periods of the modulation function of the super structure grating. In this case, performance of the super structure grating severely deteriorates, and flatness of the reflectance spectrum is extremely poor. Consequently, the laser is prone to various types of performance deterioration such as uneven output power, likely mode hopping, and mode missing.

Therefore, in this embodiment of the present disclosure, the super structure grating (SSG) is used as the reflector, and regions in the super structure grating that correspond to any two lateral support structures on a same side of the suspended structure in which the super structure grating is located fall at different locations in the spatial period of the super structure grating. This helps avoid deterioration of the flatness of the reflectance spectrum of the super structure grating during thermal tuning, thereby helping avoid deterioration of the performance of the tunable laser.

Optionally, a quantity of openings in at least one column of openings of the first column of openings 12 or the second column of openings 13 is different from a quantity of modulation periods of the super structure grating 08. This helps further avoid deterioration of the flatness of the reflectance spectrum of the super structure grating, thereby improving thermal tuning performance of the reflector structure.

Optionally, at least one of the first column of openings 12 and the second column of openings 13 includes a plurality of regularly arranged openings, and a distance between any two adjacent openings in the first column of openings 12 and/or the second column of openings 13 is different from the spatial period of the super structure grating.

Herein, the plurality of regularly arranged openings mean that all of the plurality of openings are equal in size, and a same distance exists between every two adjacent openings.

A method for calculating a distance between any two adjacent openings is not limited in this embodiment of the present disclosure. For example, a distance between any two adjacent openings may be a distance between left end portions or right end portions of the two openings or a distance between centers of the two openings.

Optionally, the modulation function of the super structure grating is shown as follows $$P(z) = \begin{cases} \sum_{k=1}^{N} \cos(2\pi\Delta Fz(k-0.5)+\phi_k) & \text{For an even quantity of reflection peaks} \\ 1+2\sum_{k=1}^{N} \cos(2\pi k\Delta Fz+\phi_k) & \text{For an odd quantity of reflection peaks} \end{cases}$$

N is a quantity of reflection peaks of the modulation function of the super structure grating, and is a natural number, $\o_k$ is a phase, z represents a location on the super structure grating along a propagation direction of light, $$\Delta F = \frac{1}{\Lambda_{k+1}} - \frac{1}{\Lambda_k},$$

and $\Lambda_k$ is a spatial period of a cosine function.

Figure 7:
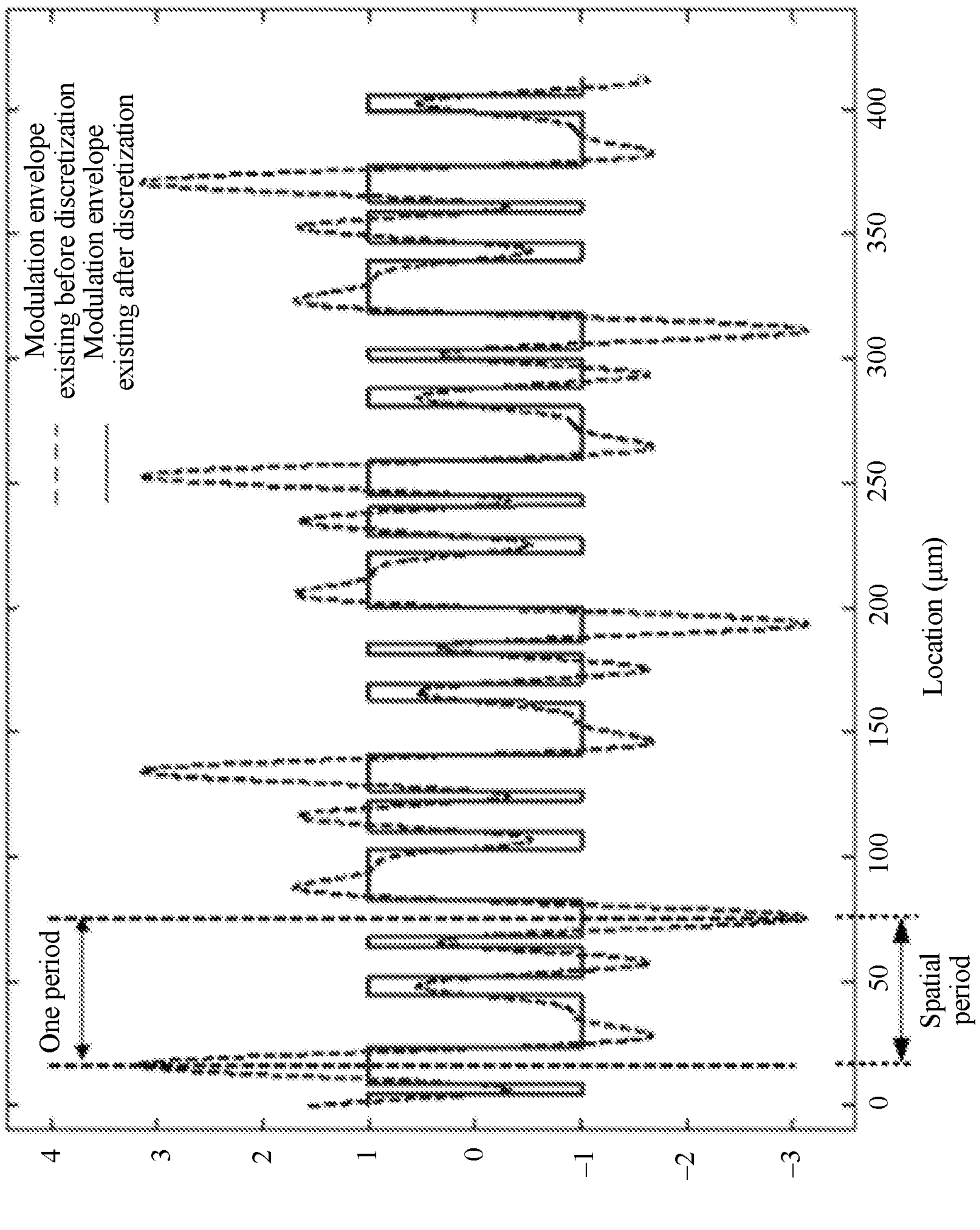
FIG. 7 is a schematic diagram of a modulation envelope of a modulation function of a super structure grating.

In some embodiments, digital discretization processing may be performed on the modulation function of the super structure grating. FIG. 7 is a schematic diagram of performing level-2 digital discretization on the super structure grating for a case of eight reflection peaks using one threshold. In FIG. 7, a horizontal coordinate represents a location on the super structure grating along a propagation direction of light, and a vertical coordinate represents amplitude of the modulation function. As shown in FIG. 7, the modulation function of the super structure grating is a simulated continuous periodic function. As shown in FIG. 7, a continuously changing dashed line is a modulation envelope existing before discretization, and a stepped solid line is a modulation envelope existing after discretization. It should be understood that, when the modulation function of the super structure grating is discretized, two or even more thresholds may alternatively be used to perform higher-level digital discretization. In other words, the super structure grating may be a super structure grating subject to level-2 discretization, a super structure grating subject to level-3 discretization, or a super structure grating subject to higher-level discretization. Optionally, the first column of openings 12 and the second column of openings 13 include a same quantity of openings.

Figure 8:
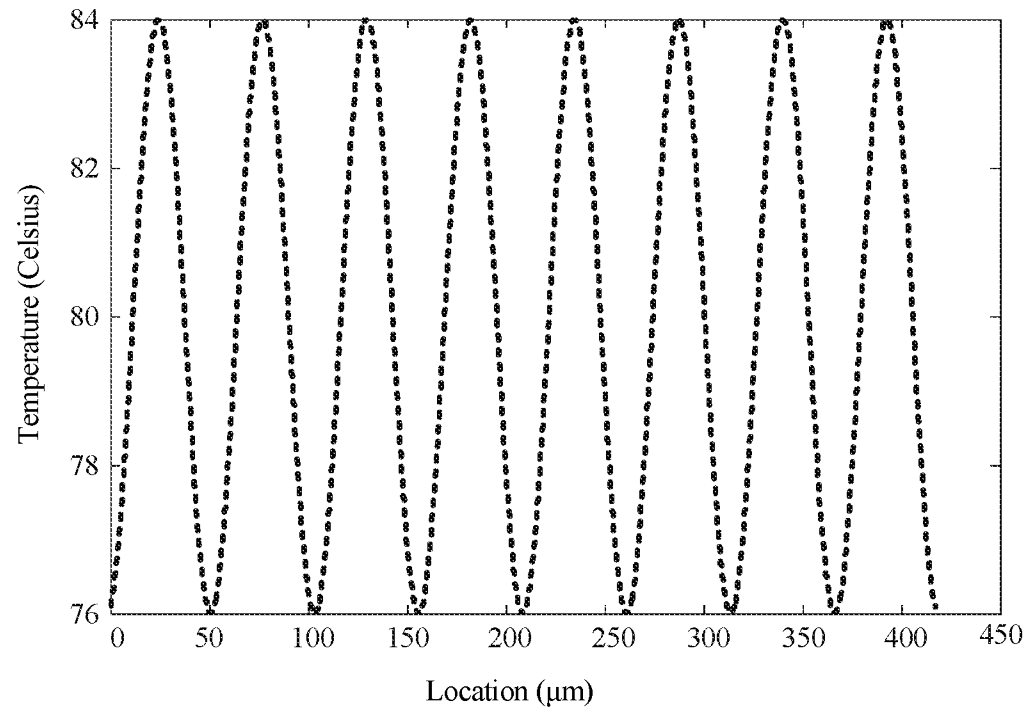
FIG. 8 is a schematic temperature distribution diagram of a super structure grating region after heating by a heater.
Figure 9:
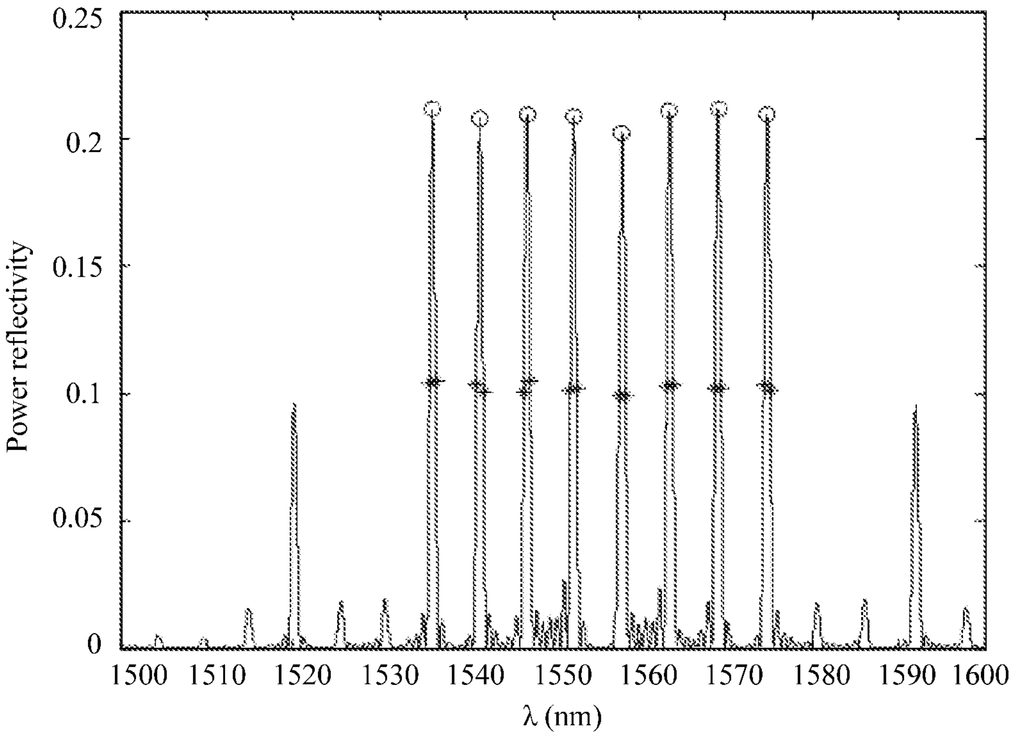
FIG. 9 is a schematic diagram of a reflectance spectrum of a reflector structure for a tunable laser according to an embodiment of the present disclosure.
Figure 10:
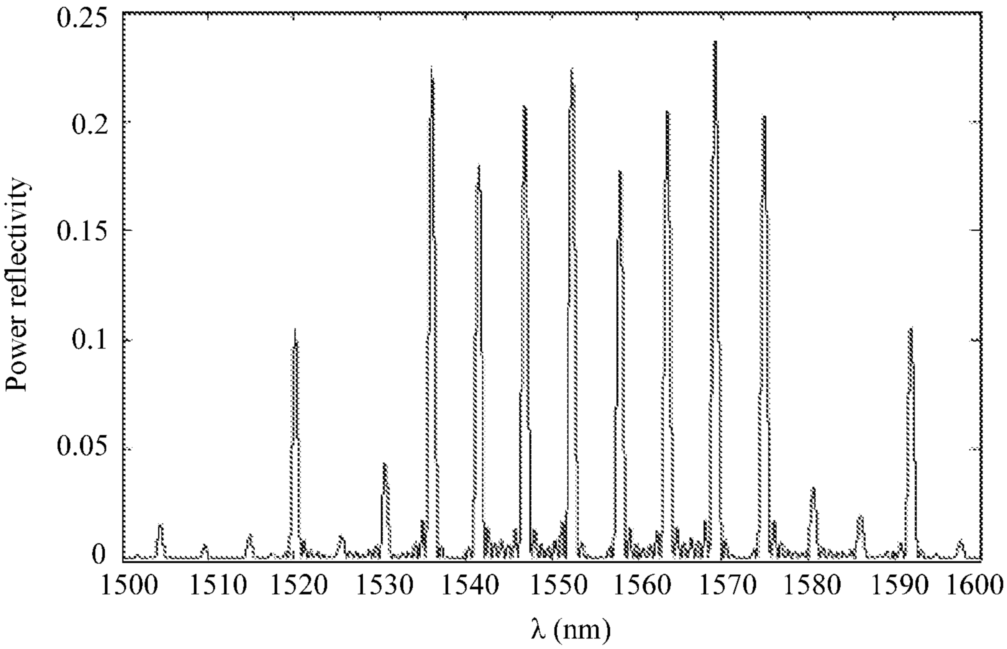
FIG. 10 is a schematic diagram of a reflectance spectrum of a reflector structure with relatively poor performance.
Figure 11:
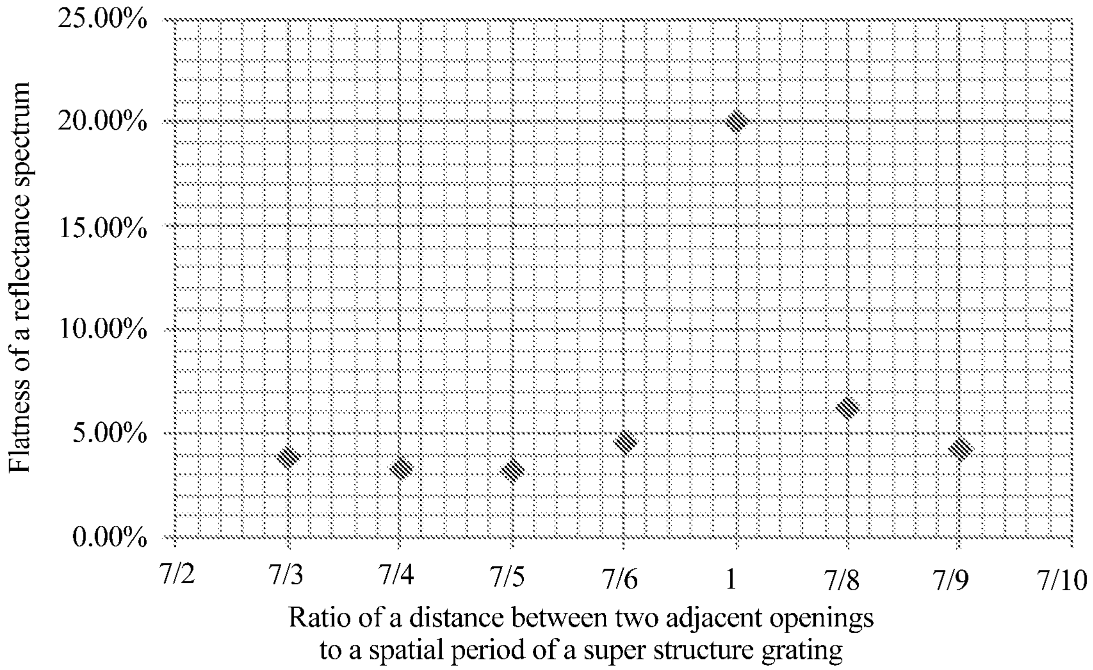
FIG. 11 is a schematic diagram of a relationship between flatness of a reflectance spectrum and a ratio of a distance between adjacent openings to a spatial period of a super structure grating.

A super structure grating whose reflectance spectrum has eight reflection peaks and whose modulation function has seven periods is used below as an example to describe the reflector structure in this embodiment of the present disclosure. It is assumed that a period of the modulation function of the super structure grating is 71 μm, and there are seven periods in total. During heating by the heater, because heat in a lateral support structure region may be dissipated along a lateral support structure, temperature of the region is slightly lower than temperature of another region. If lateral support structures are regularly distributed on two sides of the suspended structure, a temperature distribution diagram of a super structure grating region during heating is shown in FIG. 8. In FIG. 8, a horizontal coordinate represents a location on the super structure grating along a propagation direction of light, and a vertical coordinate represents temperature. As shown in FIG. 4 and FIG. 5, there are eight openings on either side of a waveguide, and regions in the super structure grating that correspond to any two lateral support structures fall at different relative locations in the spatial period of the super structure grating. In this case, after heating by the heater, the reflectance spectrum of the super structure grating is very flat (as shown in FIG. 9), and can meet an operating requirement of the laser. In FIG. 9, a horizontal coordinate represents a wavelength of light reflected by the super structure grating, and a vertical coordinate represents power reflectivity. If a lateral support structure between two adjacent openings is aligned with the peak or the valley of the modulation function of the super structure grating, performance of the super structure grating severely deteriorates, and flatness of the reflectance spectrum is extremely poor (as shown in FIG. 10). Consequently, the laser is prone to various types of performance deterioration such as uneven output power, likely mode hopping, and mode missing. When a support structure between any two adjacent openings is aligned with the peak or the valley of the modulation function of the super structure grating, a distance between the two adjacent openings is the same as the spatial period of the super structure grating. A result shown in FIG. 11 can be obtained by scanning a relationship between the flatness of the reflectance spectrum and a ratio of a distance between two adjacent openings to the spatial period of the super structure grating. As shown in FIG. 11, when the distance between the two adjacent openings is equal to the spatial period of the super structure grating (in other words, a ratio between the two is 1), the reflectance spectrum of the super structure grating severely deteriorates and the flatness is 20%. Therefore, locations and a quantity of openings may be optimized to help improve the thermal tuning performance of the reflector structure.

The flatness F of the reflectance spectrum may be calculated based on the following formula:

$$F = \frac{\max(V_{peak}) - \min(V_{peak})}{\text{mean}(V_{peak})}$$

$V_{peak}$ represents an amplitude value of a reflection peak, mean($V_{peak}$) represents an average value of amplitude values of reflection peaks, max($V_{peak}$) represents a maximum value of the reflection peak, and min($V_{peak}$) represents a minimum value of the reflection peak.

In this embodiment of the present disclosure, a distance between any two adjacent openings in at least one column of openings is different from the spatial period of the super structure grating, such that a lateral support structure between the any two openings in the at least one column of openings can be staggered from the peak or the valley of the modulation function of the super structure grating. This helps avoid deterioration of the flatness of the reflectance spectrum of the super structure grating, thereby improving the thermal tuning performance of the reflector structure. Optionally, the first column of openings 12 and the second column of openings 13 are symmetric with respect to a center line between the first column of openings 12 and the second column of openings 13. Such a structure helps simplify a manufacturing process.

It should be noted that FIG. 3, FIG. 4, and FIG. 5 merely show, as an example, that the first column of openings 12 and the second column of openings 13 are symmetric with respect to the center line between the two. However, this is not limited in this embodiment of the present disclosure. Alternatively, the first column of openings 12 and the second column of openings 13 may include different quantities of openings, and/or the first column of openings 12 and the second column of openings 13 are not symmetric with respect to the center line between the two. It should further be noted that an opening shape in this embodiment of the present disclosure is not limited to a rectangle shown in FIG. 4 and a dumbbell shape shown in FIG. 5, and may alternatively be another regular or irregular shape.

It should further be noted that in this embodiment of the present disclosure, a plurality of openings in the first column of openings 12 and/or the second column of openings 13 may be in a same size or shape, or may be in different sizes or shapes. This is not limited in this embodiment of the present disclosure. In addition, as shown in FIG. 4 and FIG. 5, shapes and sizes of two outermost openings in each of the first column of openings 12 and the second column of openings 13 may be different from a shape and a size of another opening. However, this is not limited in this embodiment of the present disclosure. Alternatively, shapes and sizes of two outermost openings in each opening may be the same as a shape and a size of another opening in the opening.

It should further be noted that a length of each of the first column of openings 12 and the second column of openings 13 may be the same as or may be different from a length of the super structure grating. In other words, outer end portions of the two outermost openings in each of the first column of openings 12 and the second column of openings 13 may or may not be aligned with end portions on the two sides of the super structure grating. This is not limited in this embodiment of the present disclosure.

Figure 12:
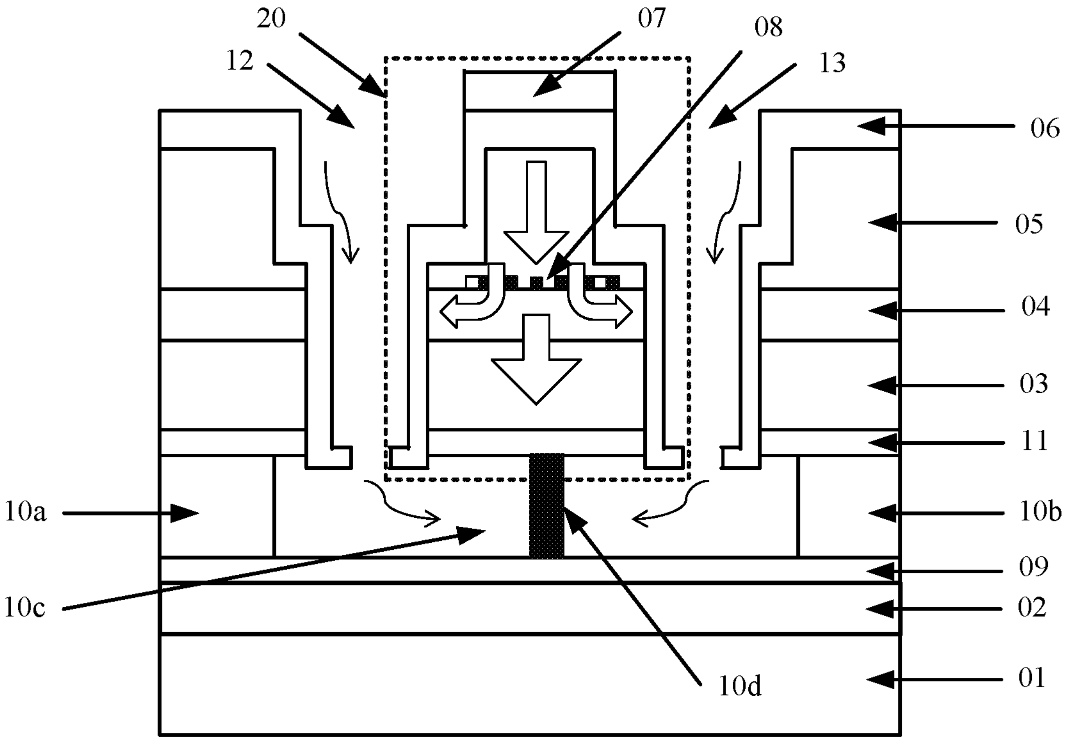
FIG. 12 is a schematic view of a cross section of a reflector structure for a tunable laser according to another embodiment of the present disclosure.

An embodiment of the present disclosure further provides another reflector structure for a tunable laser. As shown in FIG. 12, a difference between the reflector structure and the reflector structure shown in FIG. 3 to FIG. 5 lies in that the support layer 10 further includes at least one bottom support structure 10*d*. The at least one bottom support structure 10*d* is configured to support, from bottom, the suspended structure 20 above the space 10*c*. In this embodiment of the present disclosure, the bottom support structure is disposed to provide a bottom support for the suspended structure, such that mechanical strength of the suspended structure can be further enhanced.

Figure 13:
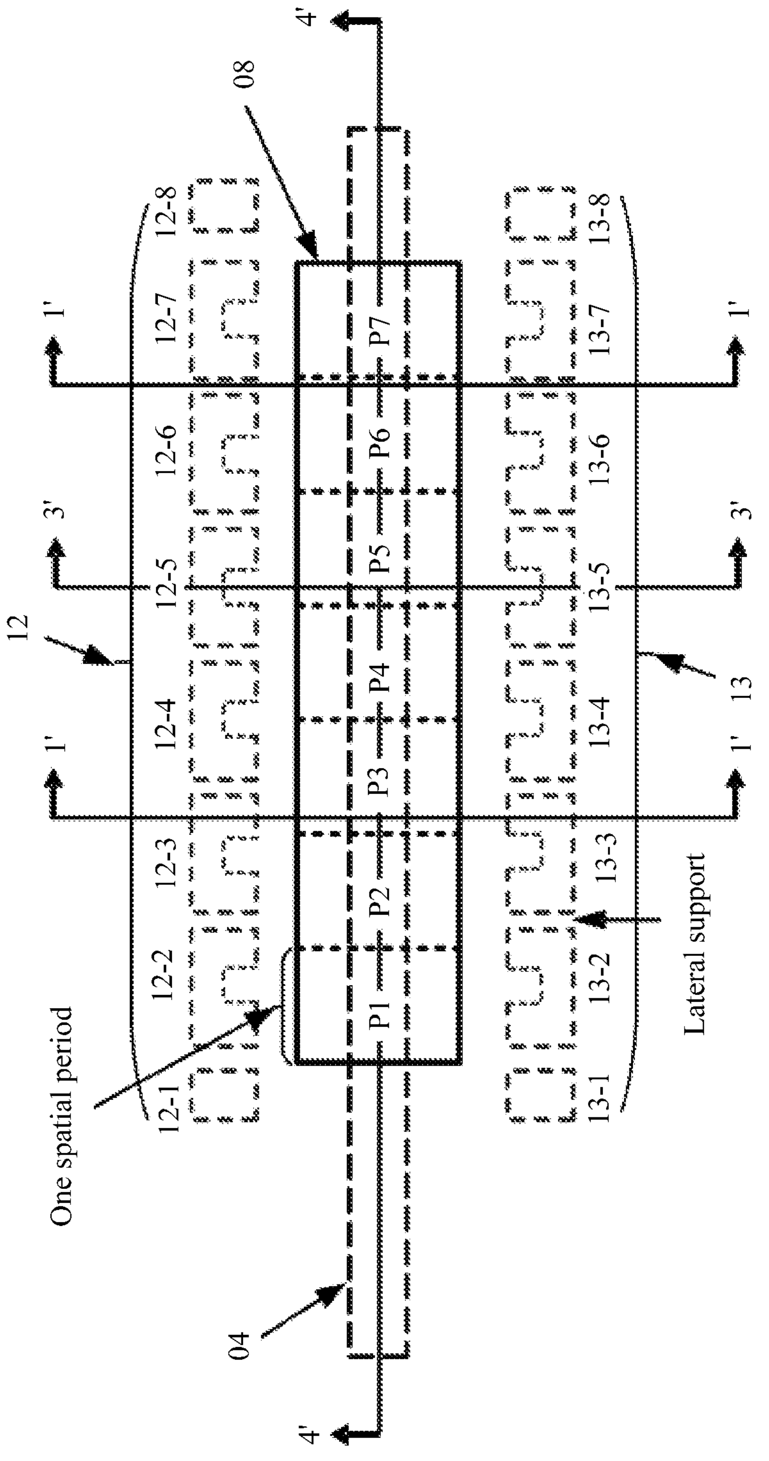
FIG. 13 is a top view of a reflector structure for a tunable laser according to another embodiment of the present disclosure.
Figure 14:
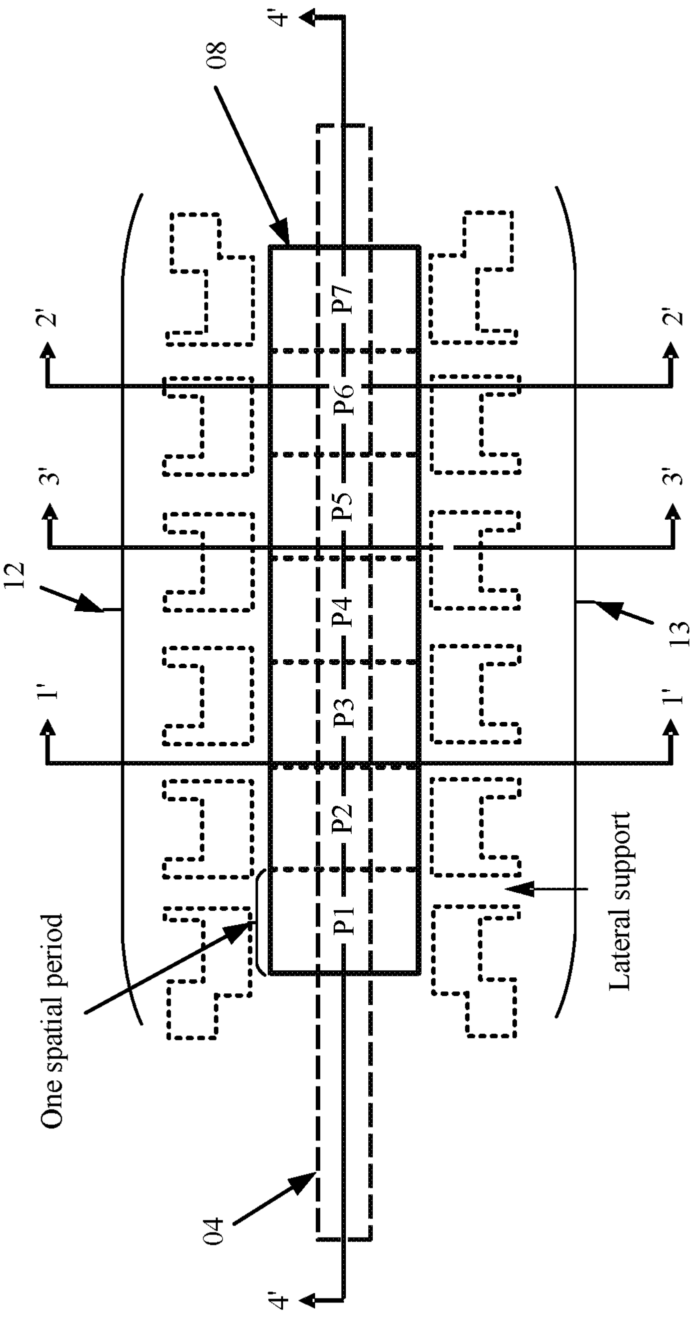
FIG. 14 is a top view of a reflector structure for a tunable laser according to another embodiment of the present disclosure.

Optionally, the at least one bottom support structure 10*d* may be located right below the suspended structure 20, as shown in FIG. 12. In this way, the suspended structure can be supported from bottom to enhance the mechanical strength of the suspended structure. FIG. 13 and FIG. 14 each are a top view of the reflector structure shown in FIG. 12. As shown in FIG. 13 and FIG. 14, each opening has a different width in the propagation direction of light. In a reflector structure manufacturing process, a relatively large amount of etchant is injected into a relatively-wide-opening part, and a relatively small amount of etchant is injected into a relatively-narrow-opening place. Therefore, a material that is below the suspended structure and that corresponds to a relatively-narrow-opening region is not totally etched by the etchant, such that a remaining partial material can form a bottom support structure below the suspended structure, but a material of a relatively-wide-opening region is totally etched. FIG. 12 is a schematic view of a cross section 3'-3' of a relatively-narrow-opening part in FIG. 13 or FIG. 14.

In addition, the etchant injected from openings further laterally etches a material of a region that is below the suspended structure and that corresponds to a lateral support structure. FIG. 6 is a schematic view of a cross section 1'-1' of a lateral support structure part in FIG. 13 or FIG. 14. A cross section 2'-2' of a relatively-wide-opening part in FIG. 13 or FIG. 14 is shown in FIG. 3.

It should be noted that openings shown in FIG. 13 and FIG. 14 are intended to help a person skilled in the art better understand the embodiments of the present disclosure, but are not intended to limit the scope of the embodiments of the present disclosure. Apparently, a person skilled in the art can make various equivalent modifications and variations to an opening shape based on the provided examples in FIG. 13 and FIG. 14, and such modifications or variations also fall within the scope of the embodiments of the present disclosure.

The opening shape is tuned to control an etching region of the etchant injected from openings, such that a size, a shape, and a location of the at least one bottom support structure 10*d* can be controlled. A smaller bottom support structure achieves higher thermal tuning efficiency, but provides a poorer mechanical support.

In some embodiments, a quantity of bottom support structures 10*d* may be the same as a quantity of openings in the first column of openings 12 and/or the second column of openings 13.

Figure 15:
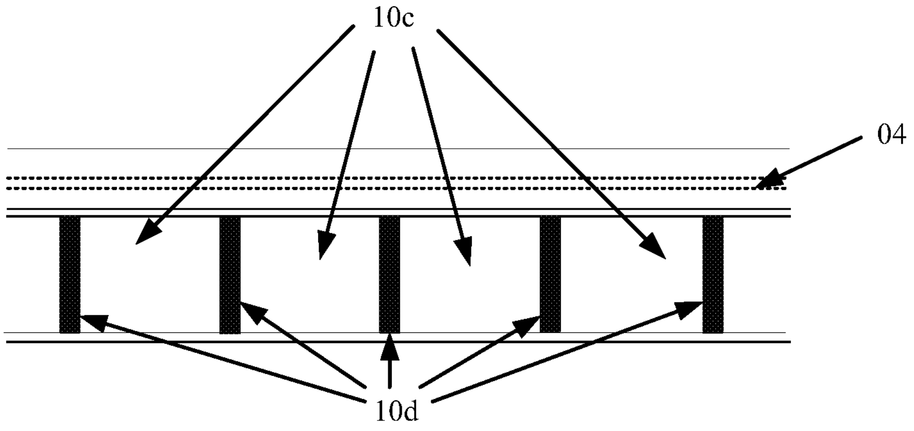
FIG. 15 is a schematic view of a cross section of a reflector structure for a tunable laser according to another embodiment of the present disclosure.

Optionally, there may be one or more bottom support structures 10*d*. FIG. 15 is a schematic view of a cross section 4'-4' in FIG. 13 or FIG. 14. As shown in FIG. 15, a plurality of bottom support structures 10*d* may be arranged in the space 10*c* along the propagation direction of light in the waveguide layer 04. Optionally, a distance between any two adjacent bottom support structures of the plurality of bottom support structures 10*d* is different from the spatial period of the super structure grating.

For other parts in the reflector structure shown in FIG. 12, FIG. 13, and FIG. 14, refer to related descriptions of the reflector structure shown in FIG. 3 to FIG. 6. Details are not described herein again.

In the reflector structure in some embodiments of the present disclosure, leftmost and rightmost openings in the first column of openings 12 and the second column of openings 13 can be configured to avoid excessively low temperature on the two sides of the super structure grating 08.

It should be noted that in some embodiments of the present disclosure, a proportion of an opening width to an interval width between openings is tunable, and a larger opening width achieves higher thermal tuning efficiency, but provides a poorer mechanical support.

It should be noted that a suspended structure manufacturing process is not limited in the embodiments of the present disclosure. For example, an etchant may be used to etch materials of various layers to obtain the suspended structure. For example, the etchant may be injected from the openings on the upper surface of the dielectric layer, reach the support layer by partially etching the upper cladding layer, the waveguide layer, and the lower cladding layer in sequence from top to bottom, and then laterally etch a part of a material that is in the support layer and that is below the reflector, to form the suspended structure.

In some embodiments of the present disclosure, the upper barrier layer 11 can be configured to prevent the lower cladding layer 03 from being etched, and the lower barrier layer 09 can be configured to prevent the buffer layer 02 from being etched. For example, the upper barrier layer 11 and the lower barrier layer 09 do not react with the etchant, or etching reaction rates of the upper barrier layer 11 and the lower barrier layer 09 are different from an etching reaction rate of the support layer 10. It should be noted that the upper barrier layer 11 and/or the lower barrier layer 09 may alternatively not be disposed in the reflector in the embodiments of the present disclosure. In some embodiments, a material of the upper barrier layer 11 in the reflector structure may be InGaAs, and a thickness of the upper barrier layer 11 may be 10 nm to 1000 nm. A material of the lower barrier layer 09 may be InGaAs, and a thickness of the lower barrier layer 09 may be 10 nm to 1000 nm. Optionally, the support layer 10 may include three layers, for example, the three layers are respectively made of InP, InAlAs, and InP, and a thickness of the support layer 10 may be 100 nm to 10000 nm.

In some embodiments, a combination of materials of the three layers: the upper barrier layer 11, the support layer 10, and the lower barrier layer 09 may alternatively be any one of the following: InP, InGaAs, and InP; InP, InAlAs, and InP; InGaAs, InP, and InGaAs; InAlAs, InP, and InAlAs; or InGaAsP, InP, and InGaAsP. Optionally, when the support layer 10 is made of three layers of materials, a combination of materials of the upper barrier layer 11, the support layer 10, and the lower barrier layer 09 may alternatively be: InGaAs, InP—InGaAs—InP, and InGaAs; InAlAs, InP—InAlAs—InP, and InAlAs; InAlAs, InP—InGaAs—InP, and InAlAs; InGaAsP, InP—InAlAs—InP, and InGaAs; InGaAsP, InP—InAlAs—InP, and InGaAsP; or the like. InP—InGaAs—InP indicates that the support layer 10 is made of InP, InGaAs, and InP, and InP—InAlAs—InP indicates that the support layer 10 is made of InP, InAlAs, and InP. The foregoing descriptions are merely some examples of the materials of the upper barrier layer, the support layer, and the lower barrier layer. This is not limited in the embodiments of the present disclosure. A person skilled in the art can make various equivalent modifications and variations based on these examples, and such modifications or variations also fall within the scope of the embodiments of the present disclosure.

Another embodiment of the present disclosure further provides a tunable laser. The tunable laser includes a gain region, a first phase region, a multimode interference coupler, a first reflector structure, and a second reflector structure. A first end of the first phase region is connected to a first end of the gain region, a second end of the first phase region is connected to a first end of the multimode interference coupler, a second end of the multimode interference coupler is connected to a first end of the first reflector structure, and a third end of the multimode interference coupler is connected to a first end of the second reflector. For a structure of the tunable laser, refer to FIG. 1. The phase region, the reflector 1, and the reflector 2 in FIG. 1 respectively correspond to the first phase region, the first reflector structure, and the second reflector structure in this embodiment of the present disclosure.

It should be noted that in the tunable laser in this embodiment of the present disclosure, at least one of the first reflector structure and the second reflector structure uses the reflector structure provided above in the embodiments of the present disclosure. In the tunable laser in this embodiment of the present disclosure, the reflector structure provided above in the embodiments of the present disclosure is used to help reduce overall power consumption of the tunable laser.

Figure 16:
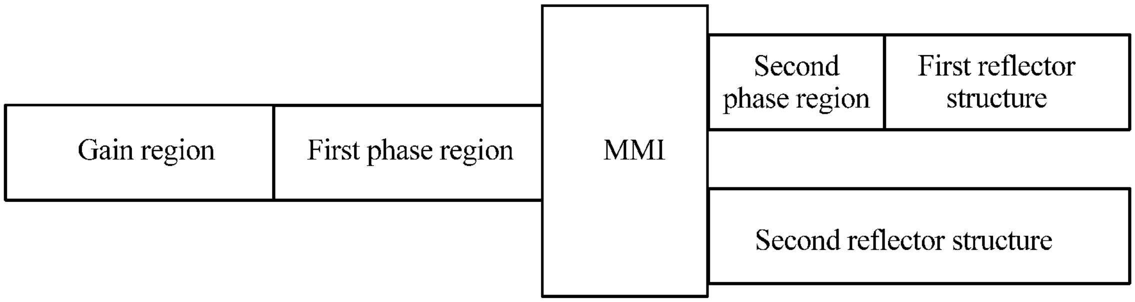
FIG. 16 is a schematic structural diagram of a tunable laser according to an embodiment of the present disclosure.

Optionally, as shown in FIG. 16, the tunable laser in this embodiment of the present disclosure may further include a second phase region, and the second phase region is located between the first reflector structure and the multimode interference coupler or between the second reflector structure and the multimode interference coupler. This can match phases of reflectance spectrums of the two reflector structures. For example, a first end of the second phase region is connected to the second end of the multimode interference coupler, and a second end of the second phase region is connected to the first end of the first reflector structure; or a first end of the second phase region is connected to the third end of the multimode interference coupler, and a second end of the second phase region is connected to the first end of the second reflector structure.

Figure 17:
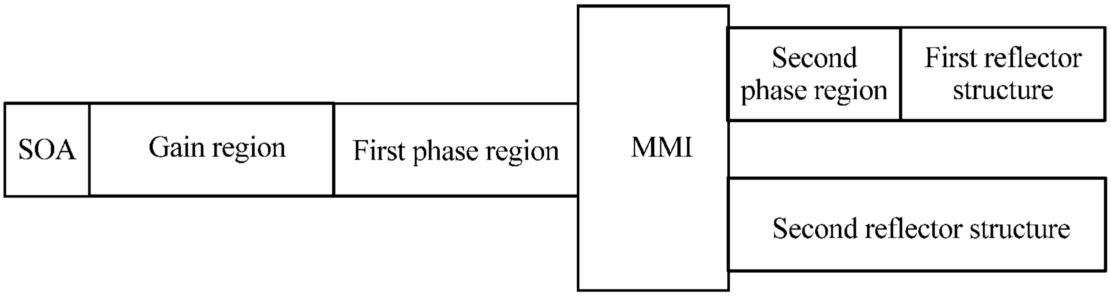
FIG. 17 is a schematic structural diagram of a tunable laser according to another embodiment of the present disclosure.

Optionally, the tunable laser in this embodiment of the present disclosure may further include one semiconductor optical amplifier (SOA). As shown in FIG. 17, the SOA is connected to a second end of the gain region. Alternatively, the SOA is connected to a second end of the first reflector structure or the second reflector structure. Alternatively, the tunable laser may further include two SOAs, one SOA is connected to a second end of the gain region, and the other SOA is connected to a second end of the first reflector structure or the second reflector structure. Alternatively, the tunable laser may further include three SOAs, and the three SOAs are respectively connected to a second end of the gain region, a second end of the first reflector structure, and a second end of the second reflector structure. The SOA is integrated, such that optical output power of the tunable laser can be amplified.

Figure 18:
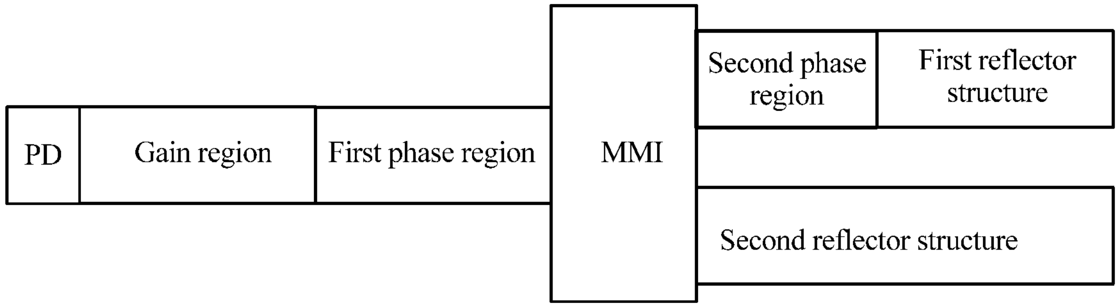
FIG. 18 is a schematic structural diagram of a tunable laser according to another embodiment of the present disclosure.

Optionally, the tunable laser in this embodiment of the present disclosure may further include one photodiode PD. As shown in FIG. 18, the PD is connected to a second end of the gain region. Alternatively, the PD is connected to a second end of the first reflector structure, or connected to a second end of the second reflector structure. Alternatively, the tunable laser may further include two PDs, one PD is connected to a second end of the first reflector structure, and the other PD is connected to a second end of the second reflector structure. The PD is integrated, such that power monitoring or power attenuation can be performed on the tunable laser.

Figure 19:
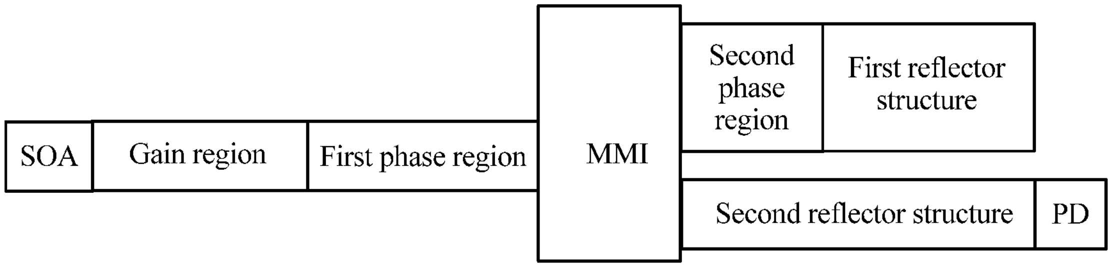
FIG. 19 is a schematic structural diagram of a tunable laser according to another embodiment of the present disclosure.

It should be noted that both an SOA and a PD may alternatively be integrated into the tunable laser in this embodiment of the present disclosure. In this way, optical output power of the tunable laser can be amplified, and further power monitoring or power attenuation can be performed. For example, the SOA may be connected to a second end of the gain region, and the PD is connected to a second end of the first reflector structure or the second reflector structure, as shown in FIG. 19. It should be understood that, alternatively, the SOA may be connected to a second end of the first reflector structure or the second reflector structure, and the PD is connected to a second end of the gain region.

It should be noted that the second phase region may alternatively not be disposed between the MMI and the first reflector structure in the tunable laser shown in FIG. 17 or FIG. 18.

Figure 20:
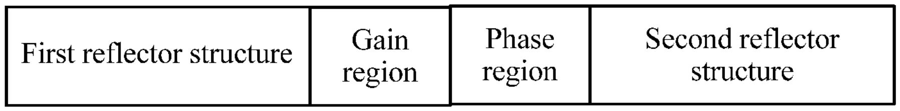
FIG. 20 is a schematic structural diagram of a tunable laser according to another embodiment of the present disclosure.

Another embodiment of the present disclosure further provides another tunable laser. As shown in FIG. 20, the tunable laser includes a first reflector structure, a gain region, a phase region, and a second reflector structure. A first end of the first reflector structure is connected to a first end of the gain region, a second end of the gain region is connected to a first end of the phase region, a second end of the phase region is connected to a first end of the second reflector structure, and at least one of the first reflector structure and the second reflector structure uses the reflector structure provided above in the embodiments of the present disclosure. In the tunable laser in this embodiment of the present disclosure, the reflector structure provided above in the embodiments of the present disclosure is used to help reduce overall power consumption of the tunable laser.

Figure 21:
FIG. 21 is a schematic structural diagram of a tunable laser according to another embodiment of the present disclosure.

Optionally, as shown in FIG. 21, the tunable laser may further include one SOA. The SOA is connected to a second end of the first reflector structure or the second reflector structure. Alternatively, the tunable laser may further include two SOAs, one SOA is connected to a second end of the first reflector structure, and the other SOA is connected to a second end of the second reflector structure. The SOA is integrated, such that optical output power of the tunable laser can be amplified.

Figure 22:
FIG. 22 is a schematic structural diagram of a tunable laser according to another embodiment of the present disclosure.

Optionally, as shown in FIG. 22, the tunable laser may further include one PD. The PD is connected to a second end of the first reflector structure or the second reflector structure. Alternatively, the tunable laser may further include two PDs, one PD is connected to a second end of the first reflector structure, and the other PD is connected to a second end of the second reflector structure. The PD is integrated, such that power monitoring or power attenuation can be performed on the tunable laser.

Figure 23:
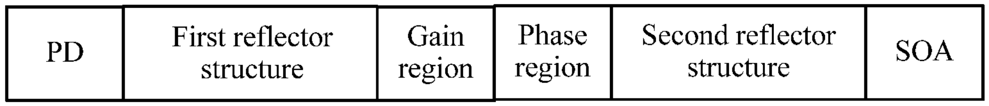
FIG. 23 is a schematic structural diagram of a tunable laser according to another embodiment of the present disclosure.

Optionally, as shown in FIG. 23, the tunable laser may further include an SOA and a PD. The SOA is connected to a second end of the first reflector structure, and the PD is connected to a second end of the second reflector structure. Alternatively, the SOA is connected to a second end of the second reflector structure, and the PD is connected to a second end of the first reflector structure. In this way, optical output power of the tunable laser can be amplified, and further power monitoring or power attenuation can be performed.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A reflector structure for a tunable laser, comprising:

a substrate layer, a support layer, a lower cladding layer, a waveguide layer, an upper cladding layer, and a heating layer that are stacked in sequence from bottom to top, wherein the reflector structure further comprises a super structure grating, the super structure grating is disposed between the upper cladding layer and the lower cladding layer along a propagation direction of light in the waveguide layer, and the heating layer is located in a region that is on an upper surface of the upper cladding layer opposite from the super structure grating and that is right opposite the super structure grating;

the support layer comprises a first support sublayer and a second support sublayer, the first support sublayer and the second support sublayer are located respectively on two sides of an upper surface of the substrate layer along the propagation direction of light in the waveguide layer, and a space extending along the propagation direction of light in the waveguide layer is formed among the substrate layer, the first support sublayer, the second support sublayer, and the lower cladding layer; and the reflector structure further comprises:

a first column of openings and a second column of openings disposed on the upper surface of the upper cladding layer along the propagation direction of light in the waveguide layer;

wherein the first column of openings and the second column of openings are respectively located on two sides of the region that is on the upper surface of the upper cladding layer and that is right opposite the super structure grating, the first column of openings and the second column of openings each comprise a plurality of openings, and each of the plurality of openings reaches the space by downwards penetrating through the upper cladding layer, the waveguide layer, and the lower cladding layer, thereby forming a suspended structure in a region that is above the space and that is located between the first column of openings and the second column of openings, and a plurality of lateral support structures of the suspended structure is respectively formed in regions between two adjacent openings in the first column of openings and the second column of openings;

a first lateral support structure corresponds to a first region of a first spatial period in the super structure grating, a second lateral support structure corresponds to a second region of a second spatial period in the super structure grating, a relative location of the first region in the first spatial period is different from a relative location of the second region in the second spatial period, and the first lateral support structure and the second lateral support structure are any two lateral support structures of the plurality of support structures located on a same side of the suspended structure; and lateral support structures in adjacent spatial periods of the super structure rating are located at different relative locations.

2. The reflector structure of claim 1, wherein a quantity of openings in at least one column of openings of the first column of openings or the second column of openings is different from a quantity of modulation periods of the super structure grating.

3. The reflector structure of claim 1, wherein the first column of openings and the second column of openings respectively comprise a same quantity of openings.

4. The reflector structure of claim 1, wherein the first column of openings and the second column of openings are symmetric with respect to a center line between the first column of openings and the second column of openings.

5. The reflector structure of claim 1, wherein at least one column of openings of the first column of openings and the second column of openings comprises a plurality of regularly arranged openings, and a distance between any two adjacent openings in the first column of openings or the second column of openings is different from a spatial period of the super structure grating.

6. The reflector structure of claim 1, wherein the support layer further comprises at least one bottom support structure, and the at least one bottom support structure is configured to support the suspended structure from the bottom.

7. The reflector structure of claim 6, wherein the at least one bottom support structure comprises a plurality of bottom support structures, and the plurality of bottom support structures are arranged in the space along the propagation direction of light in the waveguide layer.

8. The reflector structure of claim 7, wherein a distance between any two adjacent bottom structures of the plurality of bottom support structures is different from a spatial period of the super structure grating.

9. The reflector structure of claim 6, wherein each opening of the first column of openings and the second column of openings has a different width in the propagation direction of light in the waveguide layer.

10. The reflector structure of claim 9, wherein the at least one bottom support structure comprises a plurality of bottom support structures, the plurality of bottom support structures are arranged at locations where the first column of openings and the second column of openings have a narrow width.

11. The reflector structure of claim 10, wherein a distance between any two adjacent bottom structures of the plurality of bottom support structures is different from a spatial period of the super structure grating.

12. The reflector structure of claim 1, further comprising:

an upper barrier layer and a lower barrier layer, wherein the upper barrier layer is located between the lower cladding layer and the support layer, and the lower barrier layer is located between the support layer and the substrate layer.

13. The reflector structure of claim 1, further comprising:

a dielectric layer, wherein the dielectric layer is located between the upper cladding layer and the heating layer, and the heating layer is located in a region that is on an upper surface of the dielectric layer and that is right opposite to the super structure grating.

14. The reflector structure of claim 13, wherein the dielectric layer further covers an inner wall of each opening of the first column of openings and the second column of openings.

15. The reflector structure of claim 1, wherein the super structure grating is located in the upper cladding layer, or partially located in the upper cladding layer and partially located in the waveguide layer, or located in the waveguide layer, or partially located in the lower cladding layer and partially located in the waveguide layer, or located in the lower cladding layer.

16. A tunable laser, comprising:

a gain region, a first phase region, a multimode interference coupler, a first reflector structure, and a second reflector structure, wherein a first end of the first phase region is connected to a first end of the gain region, a second end of the first phase region is connected to a first end of the multimode interference coupler, a second end of the multimode interference coupler is connected to a first end of the first reflector structure, and a third end of the multimode interference coupler is connected to a first end of the second reflector structure; and at least one of the first reflector structure and the second reflector structure comprises the reflector structure of claim 1.

17. The tunable laser of claim 16, further comprising a second phase region, wherein a first end of the second phase region is connected to the second end of the multimode interference coupler, and a second end of the second phase region is connected to the first end of the first reflector structure.

18. The tunable laser of claim 16, further comprising a semiconductor optical amplifier, wherein the semiconductor optical amplifier is connected to a second end of the gain region, or connected to a second end of the first reflector structure, or connected to a second end of the second reflector structure.

19. The tunable laser of claim 16, further comprising a photodiode, wherein the photodiode is connected to a second end of the gain region, or connected to a second end of the first reflector structure, or connected to a second end of the second reflector structure.

20. A tunable laser, comprising:

a first reflector structure, a gain region, a phase region, and a second reflector structure, wherein a first end of the first reflector structure is connected to a first end of the gain region, a second end of the gain region is connected to a first end of the phase region, and a second end of the phase region is connected to a first end of the second reflector structure; and at least one of the first reflector structure and the second reflector structure comprises the reflector structure of claim 1.

* * * * *